(12) United States Patent
Park et al.

(10) Patent No.: US 10,623,023 B2
(45) Date of Patent: Apr. 14, 2020

(54) BIT INTERLEAVER FOR LOW-DENSITY PARITY CHECK CODEWORD HAVING LENGTH OF 64800 AND CODE RATE OF 5/15 AND 64-SYMBOL MAPPING, AND BIT INTERLEAVING METHOD USING SAME

(71) Applicant: ELECTRONICS AND TELECOMMUNICATIONS RESEARCH INSTITUTE, Daejeon (KR)

(72) Inventors: Sung-Ik Park, Daejeon (KR); Sun-Hyoung Kwon, Daejeon (KR); Jae-Young Lee, Daejeon (KR); Heung-Mook Kim, Daejeon (KR); Nam-Ho Hur, Sejong (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/202,519

(22) Filed: Nov. 28, 2018

(65) Prior Publication Data

US 2019/0097660 A1 Mar. 28, 2019

Related U.S. Application Data

(63) Continuation of application No. 15/423,539, filed on Feb. 2, 2017, now Pat. No. 10,177,790, which is a
(Continued)

(30) Foreign Application Priority Data

Feb. 20, 2014 (KR) .................. 10-2014-0019894
Feb. 27, 2014 (KR) .................. 10-2014-0023601

Jan. 20, 2015 (KR) .................. 10-2015-0009441

(51) Int. Cl.
*H03M 13/27* (2006.01)
*H03M 13/11* (2006.01)
(Continued)

(52) U.S. Cl.
CPC ..... *H03M 13/2792* (2013.01); *H03M 13/116* (2013.01); *H03M 13/1148* (2013.01);
(Continued)

(58) Field of Classification Search
CPC ................................... H03M 13/17
(Continued)

(56) References Cited

U.S. PATENT DOCUMENTS 9,602,321 B2 * 3/2017 Baek .................. H04L 27/2627
10,027,518 B2 * 7/2018 Hong .................. H04L 27/2602
(Continued)

FOREIGN PATENT DOCUMENTS

EP 2525495 A1 11/2012

Primary Examiner — Fritz Alphonse

(57) ABSTRACT

A bit interleaver includes a first memory, a processor, and a second memory. The first memory stores a low-density parity check (LDPC) codeword having a length of 64800 and a code rate of 5/15. The processor generates an interleaved codeword by interleaving the LDPC codeword on a bit group basis. The size of the bit group corresponds to a parallel factor of the LDPC codeword. The second memory provides the interleaved codeword to a modulator for 64-symbol mapping.

8 Claims, 6 Drawing Sheets

Related U.S. Application Data continuation of application No. 14/625,550, filed on Feb. 18, 2015, now Pat. No. 9,602,135.

(51) Int. Cl.
*H03M 13/25* (2006.01)
*H04L 1/00* (2006.01)

(52) U.S. Cl.
CPC ..... *H03M 13/1185* (2013.01); *H03M 13/255* (2013.01); *H03M 13/2778* (2013.01); *H04L 1/0041* (2013.01); *H04L 1/0045* (2013.01); *H04L 1/0058* (2013.01); *H04L 1/0071* (2013.01)

(58) Field of Classification Search
USPC ........................................ 714/762, 758, 760
See application file for complete search history.

(56) References Cited

U.S. PATENT DOCUMENTS

| | | |
|---|---|---|
| 2004/0086059 A1 | 5/2004 | Eroz et al. |
| 2010/0146365 A1* | 6/2010 | Yano ................. H03M 13/255 714/752 |
| 2011/0075710 A1 | 3/2011 | Park et al. |
| 2011/0090948 A1 | 4/2011 | Zhou et al. |
| 2011/0167317 A1 | 7/2011 | Kim et al. |
| 2013/0208836 A1* | 8/2013 | Yamamoto .............. H04L 1/005 375/341 |
| 2013/0254617 A1 | 9/2013 | Shinohara et al. |
| 2015/0078473 A1* | 3/2015 | Ko ....................... H04L 1/0042 375/267 |
| 2019/0075002 A1* | 3/2019 | Loghin ............... H04L 27/0008 |

* cited by examiner

BIT INTERLEAVER FOR LOW-DENSITY PARITY CHECK CODEWORD HAVING LENGTH OF 64800 AND CODE RATE OF 5/15 AND 64-SYMBOL MAPPING, AND BIT INTERLEAVING METHOD USING SAME

CROSS-REFERENCE TO RELATED APPLICATIONS

This application is a continuation of and claims priority to U.S. application Ser. No. 15/423,539 filed Feb. 2, 2017 (now U.S. Pat. No. 10,177,790 issued Jan. 8, 2019), which is a continuation of and claims priority to U.S. application Ser. No. 14/625,550 filed Feb. 18, 2015 (now U.S. Pat. No. 9,602,135 issued Mar. 21, 2017), which claims the benefit of Korean Patent Application Nos. 10-2014-0019894, 10-2014-0023601 and 10-2015-0009441, filed Feb. 20, 2014, Feb. 27, 2014 and Jan. 20, 2015, respectively, which are hereby incorporated by reference herein in their entirety.

BACKGROUND

1. Technical Field

The present disclosure relates generally to an interleaver and, more particularly, to a bit interleaver that is capable of distributing burst errors occurring in a digital broadcast channel.

2. Description of the Related Art

Bit-Interleaved Coded Modulation (BICM) is bandwidth-efficient transmission technology, and is implemented in such a manner that an error-correction coder, a bit-by-bit interleaver and a high-order modulator are combined with one another.

BICM can provide excellent performance using a simple structure because it uses a low-density parity check (LDPC) coder or a Turbo coder as the error-correction coder. Furthermore, BICM can provide high-level flexibility because it can select modulation order and the length and code rate of an error correction code in various forms. Due to these advantages, BICM has been used in broadcasting standards, such as DVB-T2 and DVB-NGH, and has a strong possibility of being used in other next-generation broadcasting systems.

However, in spite of those advantages, BICM suffers from the rapid degradation of performance unless burst errors occurring in a channel are appropriately distributed via the bit-by-bit interleaver. Accordingly, the bit-by-bit interleaver used in BICM should be designed to be optimized for the modulation order or the length and code rate of the error correction code.

SUMMARY

At least one embodiment of the present invention is directed to the provision of an intra-BICM bit interleaver that can effectively distribute burst errors occurring in a broadcasting system channel.

At least one embodiment of the present invention is directed to the provision of a bit interleaver that is optimized for an LDPC coder having a length of 64800 and a code rate of 5/15 and a modulator performing 64-symbol mapping and, thus, can be applied to next-generation broadcasting systems, such as ATSC 3.0.

In accordance with an aspect of the present invention, there is provided a bit interleaver, including a first memory configured to store a low-density parity check (LDPC) codeword having a length of 64800 and a code rate of 5/15; a processor configured to generate an interleaved codeword by interleaving the LDPC codeword on a bit group basis, the size of the bit group corresponding to a parallel factor of the LDPC codeword; and a second memory configured to provide the interleaved codeword to a modulator for 64-symbol mapping.

The 64-symbol mapping may be NUC (Non-Uniform Constellation) symbol mapping corresponding to 64 constellations (symbols).

The parallel factor may be 360, and each of the bit groups may include 360 bits.

The LDPC codeword may be represented by $(u_0, u_1, \ldots, u_{N_{ldpc}-1})$ (where $N_{ldpc}$ is 64800), and may be divided into 180 bit groups each including 360 bits, as in the following equation:

$$X_j = \{u_k | 360 \times j \le k < 360 \times (j+1), 0 \le k < N_{ldpc}\} \text{ for } 0 \le j < N_{group}$$

where $X_j$ is an j-th bit group, $N_{ldpc}$ is 64800, and $N_{group}$ is 180.

The interleaving may be performed using the following equation using permutation order:

$$Y_j = X_{\pi(j)}, \; 0 \le j \le N_{group}$$

where $X_j$ is the j-th bit group, $Y_j$ is an interleaved j-th bit group, and $\pi(j)$ is a permutation order for bit group-based interleaving (bit group-unit interleaving).

The permutation order may correspond to an interleaving sequence represented by the following equation:

$$\begin{aligned}\text{interleaving sequence}\\={\{166\ 54\ 6\ 27\ 141\ 134\ 58\ 46\ 55\ 91\ 56\ 100\ 172\ 80}\\ 18\ 152\ 12\ 108\ 170\ 29\ 144\ 147\ 106\ 165\ 17\ 127\\ 57\ 88\ 35\ 72\ 5\ 63\ 118\ 1\ 85\ 77\ 61\ 62\ 84\ 159\ 92\\ 102\ 98\ 177\ 132\ 139\ 59\ 149\ 11\ 8\ 154\ 129\ 33\\ 15\ 143\ 4\ 95\ 101\ 53\ 42\ 40\ 9\ 111\ 130\ 123\ 82\ 81\\ 114\ 119\ 175\ 157\ 41\ 38\ 128\ 161\ 52\ 142\ 7\ 26\\ 145\ 2\ 68\ 28\ 126\ 121\ 70\ 16\ 65\ 83\ 125\ 50\ 79\ 37\\ 74\ 164\ 168\ 160\ 122\ 60\ 32\ 24\ 138\ 75\ 69\ 0\ 36\\ 97\ 117\ 14\ 109\ 173\ 120\ 112\ 87\ 176\ 124\ 151\ 67\\ 13\ 94\ 105\ 133\ 64\ 76\ 153\ 31\ 136\ 140\ 150\ 39\\ 96\ 66\ 3\ 115\ 20\ 99\ 171\ 49\ 25\ 45\ 22\ 30\ 156\ 158\\ 163\ 135\ 21\ 146\ 90\ 169\ 78\ 93\ 178\ 116\ 19\ 155\\ 110\ 73\ 104\ 167\ 44\ 113\ 162\ 89\ 47\ 43\ 86\ 48\\ 107\ 71\ 137\ 51\ 174\ 103\ 131\ 179\ 148\ 10\ 23\ 34\}\end{aligned}$$

In accordance with another aspect of the present invention, there is provided a bit interleaving method, including storing an LDPC codeword having a length of 64800 and a code rate of 5/15; generating an interleaved codeword by interleaving the LDPC codeword on a bit group basis corresponding to the parallel factor of the LDPC codeword; and outputting the interleaved codeword to a modulator for 64-symbol mapping.

In accordance with still another aspect of the present invention, there is provided a BICM device, including an error-correction coder configured to output an LDPC codeword having a length of 64800 and a code rate of 5/15; a bit interleaver configured to interleave the LDPC codeword on a bit group basis corresponding to the parallel factor of the LDPC codeword and output the interleaved codeword; and a modulator configured to perform 64-symbol mapping on the interleaved codeword.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
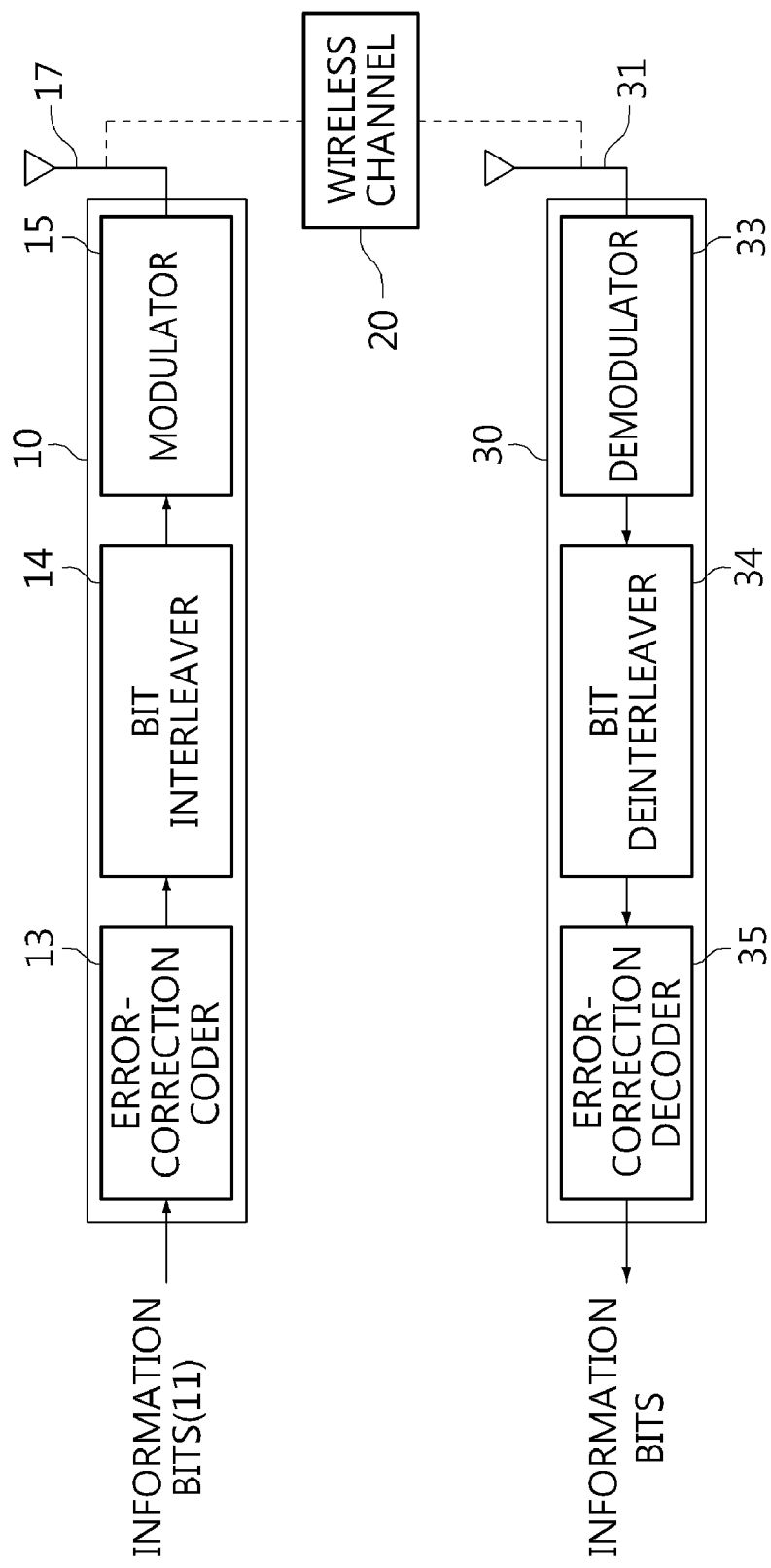
FIG. 1 is a block diagram illustrating a broadcast signal transmission and reception system according to an embodiment of the present invention.

Embodiments of the present invention will be described in detail below with reference to the accompanying drawings. Repeated descriptions and descriptions of well-known functions and configurations that have been deemed to make the gist of the present invention unnecessarily obscure will be omitted below. The embodiments of the present invention are intended to fully describe the present invention to persons having ordinary knowledge in the art to which the present invention pertains. Accordingly, the shapes, sizes, etc. of components in the drawings may be exaggerated to make the description obvious.

Embodiments of the present invention will be described in detail below with reference to the accompanying drawings.

FIG. 1 is a block diagram illustrating a broadcast signal transmission and reception system according to an embodiment of the present invention.

Referring to FIG. 1, it can be seen that a BICM device 10 and a BICM reception device 30 communicate with each other over a wireless channel 20.

The BICM device 10 generates an n-bit codeword by encoding k information bits 11 using an error-correction coder 13. In this case, the error-correction coder 13 may be an LDPC coder or a Turbo coder.

The codeword is interleaved by a bit interleaver 14, and thus the interleaved codeword is generated.

In this case, the interleaving may be performed on a bit group basis (by a unit of a bit group). In this case, the error-correction coder 13 may be an LDPC coder having a length of 64800 and a code rate of 5/15. A codeword having a length of 64800 may be divided into a total of 180 bit groups. Each of the bit groups may include 360 bits, i.e., the parallel factor of an LDPC codeword.

In this case, the interleaving may be performed on a bit group basis (by a unit of a bit group) in accordance with an interleaving sequence, which will be described later.

In this case, the bit interleaver 14 prevents the performance of error correction code from being degraded by effectively distributing burst errors occurring in a channel. In this case, the bit interleaver 14 may be separately designed in accordance with the length and code rate of the error correction code and the modulation order.

The interleaved codeword is modulated by a modulator 15, and is then transmitted via an antenna 17.

In this case, the modulator 15 may be based on a concept including symbol mapper (symbol mapping device). In this case, the modulator 15 may be a symbol mapping device performing 64-symbol mapping which maps codes onto 64 constellations (symbols).

In this case, the modulator 15 may be a uniform modulator, such as a quadrature amplitude modulation (QAM) modulator, or a non-uniform modulator.

The modulator 15 may be a symbol mapping device performing NUC (Non-Uniform Constellation) symbol mapping which uses 64 constellations (symbols).

The signal transmitted via the wireless channel 20 is received via the antenna 31 of the BICM reception device 30, and, in the BICM reception device 30, is subjected to a process reverse to the process in the BICM device 10. That is, the received data is demodulated by a demodulator 33, is deinterleaved by a bit deinterleaver 34, and is then decoded by an error correction decoder 35, thereby finally restoring the information bits.

It will be apparent to those skilled in the art that the above-described transmission and reception processes have been described within a minimum range required for a description of the features of the present invention and various processes required for data transmission may be added.

Figure 2:
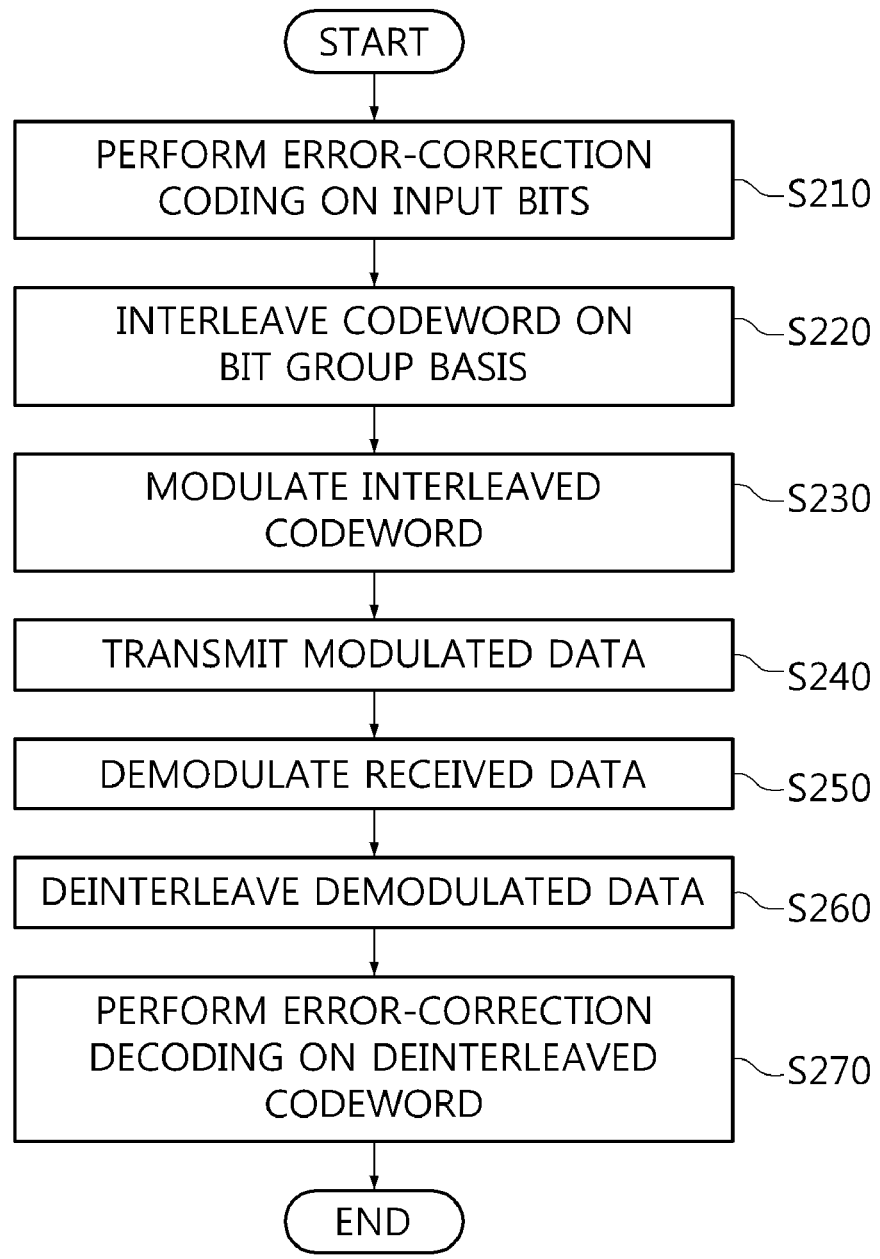
FIG. 2 is an operation flowchart illustrating a broadcast signal transmission and reception method according to an embodiment of the present invention.

FIG. 2 is an operation flowchart illustrating a broadcast signal transmission and reception method according to an embodiment of the present invention.

Referring to FIG. 2, in the broadcast signal transmission and reception method according to this embodiment of the present invention, input bits (information bits) are subjected to error-correction coding at step S210.

That is, at step S210, an n-bit codeword is generated by encoding k information bits using the error-correction coder.

In this case, step S210 may be performed as in an LDPC encoding method, which will be described later.

Furthermore, in the broadcast signal transmission and reception method, an interleaved codeword is generated by interleaving the n-bit codeword on a bit group basis at step S220.

In this case, the n-bit codeword may be an LDPC codeword having a length of 64800 and a code rate of 5/15. The codeword having a length of 64800 may be divided into a total of 180 bit groups. Each of the bit groups may include 360 bits corresponding to the parallel factors of an LDPC codeword.

In this case, the interleaving may be performed on a bit group basis (by a unit of a bit group) in accordance with an interleaving sequence, which will be described later.

Furthermore, in the broadcast signal transmission and reception method, the encoded data is modulated at step S230.

That is, at step S230, the interleaved codeword is modulated using the modulator.

In this case, the modulator may be based on a concept including symbol mapper (symbol mapping device). In this case, the modulator may be a symbol mapping device performing 64-symbol mapping which maps codes onto 64 constellations (symbols).

In this case, the modulator may be a uniform modulator, such as a QAM modulator, or a non-uniform modulator.

The modulator may be a symbol mapping device performing NUC (Non-Uniform Constellation) symbol mapping which uses 64 constellations (symbols).

Furthermore, in the broadcast signal transmission and reception method, the modulated data is transmitted at step S240.

That is, at step S240, the modulated codeword is transmitted over the wireless channel via the antenna.

Furthermore, in the broadcast signal transmission and reception method, the received data is demodulated at step S250.

That is, at step S250, the signal transmitted over the wireless channel is received via the antenna of the receiver, and the received data is demodulated using the demodulator.

Furthermore, in the broadcast signal transmission and reception method, the demodulated data is deinterleaved at step S260. In this case, the deinterleaving of step S260 may be reverse to the operation of step S220.

Furthermore, in the broadcast signal transmission and reception method, the deinterleaved codeword is subjected to error correction decoding at step S270.

That is, at step S270, the information bits are finally restored by performing error correction decoding using the error correction decoder of the receiver.

In this case, step S270 corresponds to a process reverse to that of an LDPC encoding method, which will be described later.

An LDPC code is known as a code very close to the Shannon limit for an additive white Gaussian noise (AWGN) channel, and has the advantages of asymptotically excellent performance and parallelizable decoding compared to a turbo code.

Generally, an LDPC code is defined by a low-density parity check matrix (PCM) that is randomly generated. However, a randomly generated LDPC code requires a large amount of memory to store a PCM, and requires a lot of time to access memory. In order to overcome these problems, a quasi-cyclic LDPC (QC-LDPC) code has been proposed. A QC-LDPC code that is composed of a zero matrix or a circulant permutation matrix (CPM) is defined by a PCM that is expressed by the following Equation 1:

$$H = \begin{bmatrix} J^{a_{11}} & J^{a_{12}} & \cdots & J^{a_{1n}} \\ J^{a_{21}} & J^{a_{22}} & \cdots & J^{a_{2n}} \\ \vdots & \vdots & \ddots & \vdots \\ J^{a_{m1}} & J^{a_{m2}} & \cdots & J^{a_{mn}} \end{bmatrix}, \text{ for } a_{ij} \in \{0, 1, \ldots, L-1, \infty\} \quad (1)$$

In this equation, J is a CPM having a size of L×L, and is given as the following Equation 2. In the following description, L may be 360.

$$J_{L \times L} = \begin{bmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{bmatrix} \quad (2)$$

Furthermore, $J^i$ is obtained by shifting an L×L identity matrix I ($J^0$) to the right i (0≤i<L) times, and $J^\infty$ is an L×L zero matrix. Accordingly, in the case of a QC-LDPC code, it is sufficient if only index exponent i is stored in order to store $J^i$, and thus the amount of memory required to store a PCM is considerably reduced.

Figure 3:
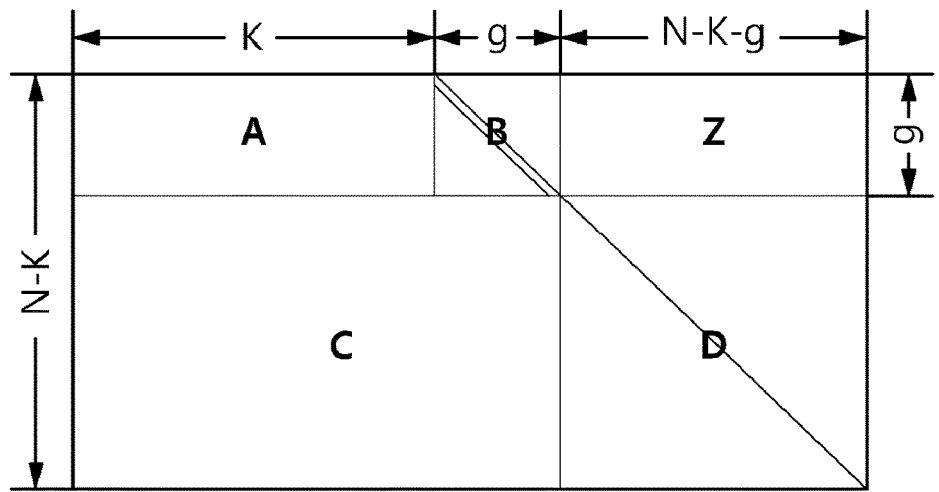
FIG. 3 is a diagram illustrating the structure of a parity check matrix (PCM) corresponding to an LDPC code to according to an embodiment of the present invention.

FIG. 3 is a diagram illustrating the structure of a PCM corresponding to an LDPC code to according to an embodiment of the present invention.

Referring to FIG. 3, the sizes of matrices A and C are g×K and (N−K−g)×(K+g), respectively, and are composed of an L×L zero matrix and a CPM, respectively. Furthermore, matrix Z is a zero matrix having a size of g×(N−K−g), matrix D is an identity matrix having a size of (N−K−g)×(N−K−g), and matrix B is a dual diagonal matrix having a size of g×g. In this case, the matrix B may be a matrix in which all elements except elements along a diagonal line and neighboring elements below the diagonal line are 0, and may be defined as the following Equation 3:

$$B_{g \times g} = \begin{bmatrix} I_{L \times L} & 0 & 0 & \cdots & 0 & 0 & 0 \\ I_{L \times L} & I_{L \times L} & 0 & \cdots & 0 & 0 & 0 \\ 0 & I_{L \times L} & I_{L \times L} & \vdots & 0 & 0 & 0 \\ \vdots & \vdots & \vdots & \ddots & \vdots & \vdots & \vdots \\ 0 & 0 & 0 & \cdots & I_{L \times L} & I_{L \times L} & 0 \\ 0 & 0 & 0 & \cdots & 0 & I_{L \times L} & I_{L \times L} \end{bmatrix} \quad (3)$$

where $I_{L \times L}$ is an identity matrix having a size of L×L.

That is, the matrix B may be a bit-wise dual diagonal matrix, or may be a block-wise dual diagonal matrix having identity matrices as its blocks, as indicated by Equation 3. The bit-wise dual diagonal matrix is disclosed in detail in Korean Patent Application Publication No. 2007-0058438, etc.

In particular, it will be apparent to those skilled in the art that when the matrix B is a bit-wise dual diagonal matrix, it is possible to perform conversion into a Quasi-cyclic form by applying row or column permutation to a PCM including the matrix B and having a structure illustrated in FIG. 3.

In this case, N is the length of a codeword, and K is the length of information.

The present invention proposes a newly designed QC-LDPC code in which the code rate thereof is 5/15 and the length of a codeword is 64800, as illustrated in the following Table 1. That is, the present invention proposes an LDPC code that is designed to receive information having a length of 21600 and generate an LDPC codeword having a length of 64800.

Table 1 illustrates the sizes of the matrices A, B, C, D and Z of the QC-LDPC code according to the present invention:

TABLE 1

| Code rate | Length | Sizes | | | | |
| | | A | B | C | D | Z |
|---|---|---|---|---|---|---|
| 5/15 | 64800 | 1440 × 21600 | 1440 × 1440 | 41760 × 23040 | 41760 × 41760 | 1080 × 41760 |

The newly designed LDPC code may be represented in the form of a sequence (progression), an equivalent relationship is established between the sequence and matrix (parity bit check matrix), and the sequence may be represented, as follows:

Sequence Table

| | |
|---|---|
| 1st row: | 221 1011 1218 4299 7143 8728 11072 15533 17356 33909 36833 |
| 2nd row: | 360 1210 1375 2313 3493 16822 21373 23588 23656 26267 34098 |
| 3rd row: | 544 1347 1433 2457 9186 10945 13583 14858 19195 34606 37441 |
| 4th row: | 37 596 715 4134 8091 12106 24307 24658 34108 40591 42883 |

Sequence Table

| | |
|---|---|
| 5th row: | 235 398 1204 2075 6742 11670 13512 23231 24784 27915 34752 |
| 6th row: | 204 873 890 13550 16570 19774 34012 35249 37655 39885 42890 |
| 7th row: | 221 371 514 11984 14972 15690 28827 29069 30531 31018 43121 |
| 8th row: | 280 549 1435 1889 3310 10234 11575 15243 20748 30469 36005 |
| 9th row: | 223 666 1248 13304 14433 14732 18943 21248 23127 38529 39272 |
| 10th row: | 370 819 1065 9461 10319 25294 31958 33542 37458 39681 40039 |
| 11st row: | 585 870 1028 5087 5216 12228 16216 16381 16937 27132 27893 |
| 12nd row: | 164 167 1210 7386 11151 20413 22713 23134 24188 36771 38992 |
| 13rd row: | 298 511 809 4620 7347 8873 19602 24162 29198 34304 41145 |
| 14th row: | 105 830 1212 2415 14759 15440 16361 16748 22123 32684 42575 |
| 15th row: | 659 665 668 6458 22130 25972 30697 31074 32048 36078 37129 |
| 16th row: | 91 808 953 8015 8988 13492 13987 15979 28355 34509 39698 |
| 17th row: | 594 983 1265 3028 4029 9366 11069 11512 27066 40939 41639 |
| 18th row: | 506 740 1321 1484 10747 16376 17384 20285 31502 38925 42606 |
| 19th row: | 338 356 975 2022 3578 18689 18772 19826 22914 24733 27431 |
| 20th row: | 709 1264 1366 4617 8893 25226 27800 29080 30277 37781 39644 |
| 21st row: | 840 1179 1338 2973 3541 7043 12712 15005 17149 19910 36795 |
| 22nd row: | 1009 1267 1380 4919 12679 22889 29638 30987 34637 36232 37284 |
| 23rd row: | 466 913 1247 1646 3049 5924 9014 20539 34546 35029 36540 |
| 24th row: | 374 697 984 1654 5870 10883 11684 20294 28888 31612 34031 |
| 25th row: | 117 240 635 5093 8673 11323 12456 14145 21397 39619 42559 |
| 26th row: | 122 1265 1427 13528 14282 15241 16852 17227 34723 36836 39791 |
| 27th row: | 595 1180 1310 6952 17916 24725 24971 27243 29555 32138 35987 |
| 28th row: | 140 470 1017 13222 13253 18462 20806 21117 28673 31598 37235 |
| 29th row: | 7 710 1072 8014 10804 13303 14292 16690 26676 36443 41966 |
| 30th row: | 48 189 759 12438 14523 16388 23178 27315 28656 29111 29694 |
| 31st row: | 285 387 410 4294 4467 5949 25386 27898 34880 41169 42614 |
| 32nd row: | 474 545 1320 10506 13186 18126 27110 31498 35353 36193 37322 |
| 33rd row: | 1075 1130 1424 11390 13312 14161 16927 25071 25844 34287 38151 |
| 34th row: | 161 396 427 5944 17281 22201 25218 30143 35566 38261 42513 |
| 35th row: | 233 247 694 1446 3180 3507 9069 20764 21940 33422 39358 |
| 36th row: | 271 508 1013 6271 21760 21858 24887 29808 31099 35475 39924 |
| 37th row: | 8 674 1329 3135 5110 14460 28108 28388 31043 31137 31863 |
| 38th row: | 1035 1222 1409 8287 16083 24450 24888 29356 30329 37834 39684 |
| 39th row: | 391 1090 1128 1866 4095 10643 13121 14499 20056 22195 30593 |
| 40th row: | 55 161 1402 6289 6837 8791 17937 21425 26602 30461 37241 |
| 41st row: | 110 377 1228 6875 13253 17032 19008 23274 32285 33452 41630 |
| 42nd row: | 360 638 1355 5933 12593 13533 23377 23881 24586 26040 41663 |
| 43rd row: | 535 1240 1333 3354 10860 16032 32573 34908 34957 39255 40759 |
| 44th row: | 526 936 1321 7992 10260 18527 28248 29356 32636 34666 35552 |
| 45th row: | 336 785 875 7530 13062 13075 18925 27963 28703 33688 36502 |
| 46th row: | 36 591 1062 1518 3821 7048 11197 17781 19408 22731 24783 |
| 47th row: | 214 1145 1223 1546 9475 11170 16061 21273 38688 40051 42479 |
| 48th row: | 1136 1226 1423 20227 22573 24951 26462 29586 34915 42441 43048 |
| 49th row: | 26 276 1425 6048 7224 7917 8747 27559 28515 35002 37649 |
| 50th row: | 127 294 437 4029 8585 9647 11904 24115 28514 36893 39722 |
| 51st row: | 748 1093 1403 9536 19305 20468 31049 38667 40502 40720 41949 |
| 52nd row: | 96 638 743 9806 12101 17751 22732 24937 32007 32594 38504 |
| 53rd row: | 649 904 1079 2770 3337 9158 20125 24619 32921 33698 35173 |
| 54th row: | 401 518 984 7372 12438 12582 18704 35874 39420 39503 39790 |
| 55th row: | 10 451 1077 8078 16320 17409 25807 28814 30613 41261 42955 |
| 56th row: | 405 592 1178 15936 18418 19585 21966 24219 30637 34536 37838 |
| 57th row: | 50 584 851 9720 11919 22544 22545 25851 35567 41587 41876 |
| 58th row: | 911 1113 1176 1806 10058 10809 14220 19044 20748 29424 36671 |
| 59th row: | 441 550 1135 1956 11254 18699 30249 33099 34587 35243 39952 |
| 60th row: | 510 1016 1281 8621 13467 13780 15170 16289 20925 26426 34479 |
| 61st row: | 4969 5223 17117 21950 22144 24043 27151 39809 |
| 62nd row: | 11452 13622 18918 19670 23995 32647 37200 37399 |
| 63rd row: | 6351 6426 13185 13973 16699 22524 31070 31916 |
| 64th row: | 4098 10617 14854 18004 28580 36158 37500 38552 |

An LDPC code that is represented in the form of a sequence is being widely used in the DVB standard.

According to an embodiment of the present invention, an LDPC code presented in the form of a sequence is encoded, as follows. It is assumed that there is an information block $S=(s_0, s_1, \ldots, s_{K-1})$ having an information size K. The LDPC encoder generates a codeword $\Lambda=(\lambda_0, \lambda_1, \lambda_2, \ldots, \lambda_{N-1})$ having a size of $N=K+M_1+M_2$ using the information block S having a size K. In this case, $M_1=g$, and $M_2=N-K-g$. Furthermore, $M_1$ is the size of parity bits corresponding to the dual diagonal matrix B, and $M_2$ is the size of parity bits corresponding to the identity matrix D. The encoding process is performed, as follows:

Initialization:

$\lambda_i = s_i$ for $i=0,1,\ldots,K-1$ $p_j = 0$ for $j=0,1,\ldots,M_1+M_2-1$ \hfill (4)

First information bit $\lambda_0$ is accumulated at parity bit addresses specified in the 1st row of the sequence of the Sequence Table. For example, in an LDPC code having a length of 64800 and a code rate of 5/15, an accumulation process is as follows:

$p_{221} = p_{221} \oplus \lambda_0 \quad p_{1011} = p_{1011} \oplus \lambda_0 \quad p_{1218} = p_{1218} \oplus \lambda_0$
$p_{4299} = p_{4299} \oplus \lambda_0 \quad p_{7143} = p_{7143} \oplus \lambda_0$ $p_{8728} = p_{8728} \oplus \lambda_0 \, p_{11072} = p_{11072} \oplus \lambda_0 \, p_{15533} = p_{15533} \oplus \lambda_0$
$p_{17356} = p_{17356} \oplus \lambda_0$ $p_{33909} = p_{33909} \oplus \lambda_0 \, p_{36833} = p_{36833} \oplus \lambda_0$ where the addition ⊕ occurs in GF(2).

The subsequent L−1 information bits, that is, $\lambda_m$, m=1, 2, ..., L−1, are accumulated at parity bit addresses that are calculated by the following Equation 5:

$(x + m \times Q_1) \bmod M_1$ if $x < M_1$ $M_1 + \{(x - M_1 + m \times Q_2) \bmod M_2\}$ if $x \geq M_1$ \hfill (5)

where x denotes the addresses of parity bits corresponding to the first information bit $\lambda_0$, that is, the addresses of the parity bits specified in the first row of the sequence of the Sequence Table, $Q_1 = M_1/L$, $Q_2 = M_2/L$, and L=360. Furthermore, $Q_1$ and $Q_2$ are defined in the following Table 2. For example, for an LDPC code having a length of 64800 and a code rate of 5/15, $M_1 = 1440$, $Q_1 = 4$, $M_2 = 41760$, $Q_2 = 116$ and L=360, and the following operations are performed on the second bit $\lambda_1$ using Equation 5:

$p_{225} = p_{225} \oplus \lambda_1 \, p_{1015} = p_{1015} \oplus \lambda_1 \, p_{1222} = p_{1222} \oplus \lambda_1 \, p_{4415} = p_{4415} \oplus \lambda_1 \, p_{7259} = p_{7259} \oplus \lambda_1$ $p_{8844} = p_{8844} \oplus \lambda_1 \, p_{11188} = p_{11188} \oplus \lambda_1 \, p_{15649} = p_{15649} \oplus \lambda_1 \, p_{17472} = p_{17472} \oplus \lambda_1$ $p_{34025} = p_{34025} \oplus \lambda_1 \, p_{36949} = p_{36949} \oplus \lambda_1$ Table 2 illustrates the sizes of $M_1$, $Q_1$, $M_2$ and $Q_2$ of the designed QC-LDPC code:

TABLE 2

| | | Sizes | | | |
|---|---|---|---|---|---|
| Code rate | Length | $M_1$ | $M_2$ | $Q_1$ | $Q_2$ |
| 5/15 | 64800 | 1440 | 41760 | 4 | 116 |

The addresses of parity bit accumulators for new 360 information bits from $\lambda_L$ to $\lambda_{2L-1}$ are calculated and accumulated from Equation 5 using the second row of the sequence.

In a similar manner, for all groups composed of new L information bits, the addresses of parity bit accumulators are calculated and accumulated from Equation 5 using new rows of the sequence.

After all the information bits from $\lambda_0$ to $\lambda_{K-1}$ have been exhausted, the operations of the following Equation 6 are sequentially performed from i=1:

$p_i = p_i \oplus p_{i-1}$ for $i = 0, 1, \ldots, M_1 - 1$ \hfill (6)

Thereafter, when a parity interleaving operation, such as that of the following Equation 7, is performed, parity bits corresponding to the dual diagonal matrix B are generated:

$\lambda_{K+L\cdot t+s} = p_{Q_1 \cdot s + t}$ for $0 \leq s < L$, $0 \leq t < Q_1$ \hfill (7)

When the parity bits corresponding to the dual diagonal matrix B have been generated using K information bits $\lambda_0$, $\lambda_1$, ..., $\lambda_{K-1}$, parity bits corresponding to the identity matrix D are generated using the $M_1$ generated parity bits $\lambda_K$, $\lambda_{K+1}$, ..., $\lambda_{K+M_1-1}$.

For all groups composed of L information bits from $\lambda_K$ to $\lambda_{K+M_1-1}$, the addresses of parity bit accumulators are calculated using the new rows (starting with a row immediately subsequent to the last row used when the parity bits corresponding to the dual diagonal matrix B have been generated) of the sequence and Equation 5, and related operations are performed.

When a parity interleaving operation, such as that of the following Equation 8, is performed after all the information bits from $\lambda_K$ to $\lambda_{K+M_1-1}$ have been exhausted, parity bits corresponding to the identity matrix D are generated:

$\lambda_{K+M_1+L\cdot t+s} = p_{M_1+Q_2 \cdot s + t}$ for $0 \leq s < L$, $0 \leq t < Q_2$ \hfill (8)

Figure 4:
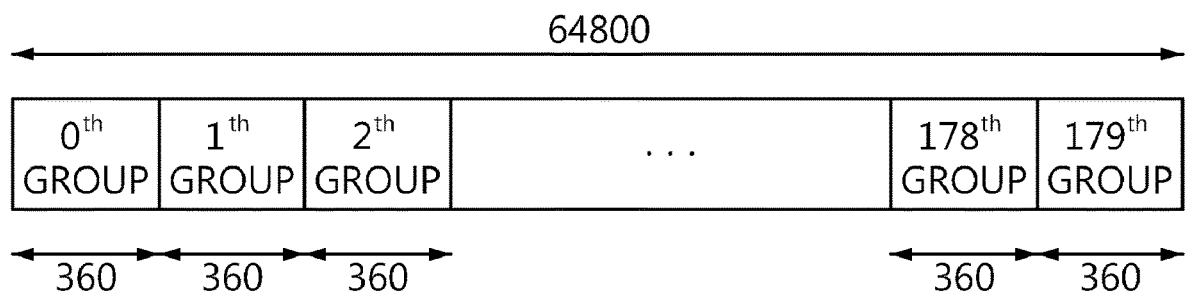
FIG. 4 is a diagram illustrating the bit groups of an LDPC codeword having a length of 64800.

FIG. 4 is a diagram illustrating the bit groups of an LDPC codeword having a length of 64800.

Referring to FIG. 4, it can be seen that an LDPC codeword having a length of 64800 is divided into 180 bit groups (a 0th group to a 179th group).

In this case, 360 may be the parallel factor (PF) of the LDPC codeword. That is, since the PF is 360, the LDPC codeword having a length of 64800 is divided into 180 bit groups, as illustrated in FIG. 4, and each of the bit groups includes 360 bits.

Figure 5:
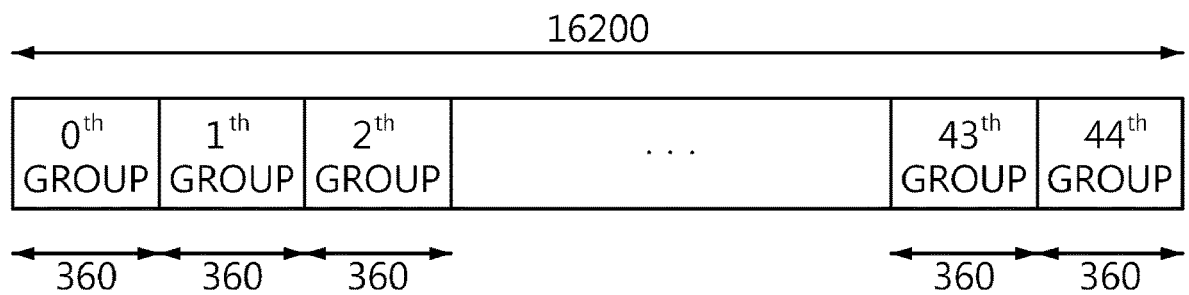
FIG. 5 is a diagram illustrating the bit groups of an LDPC codeword having a length of 16200.

FIG. 5 is a diagram illustrating the bit groups of an LDPC codeword having a length of 16200.

Referring to FIG. 5, it can be seen that an LDPC codeword having a length of 16200 is divided into 45 bit groups (a 0th group to a 44th group).

In this case, 360 may be the parallel factor (PF) of the LDPC codeword. That is, since the PF is 360, the LDPC codeword having a length of 16200 is divided into 45 bit groups, as illustrated in FIG. 5, and each of the bit groups includes 360 bits.

Figure 6:
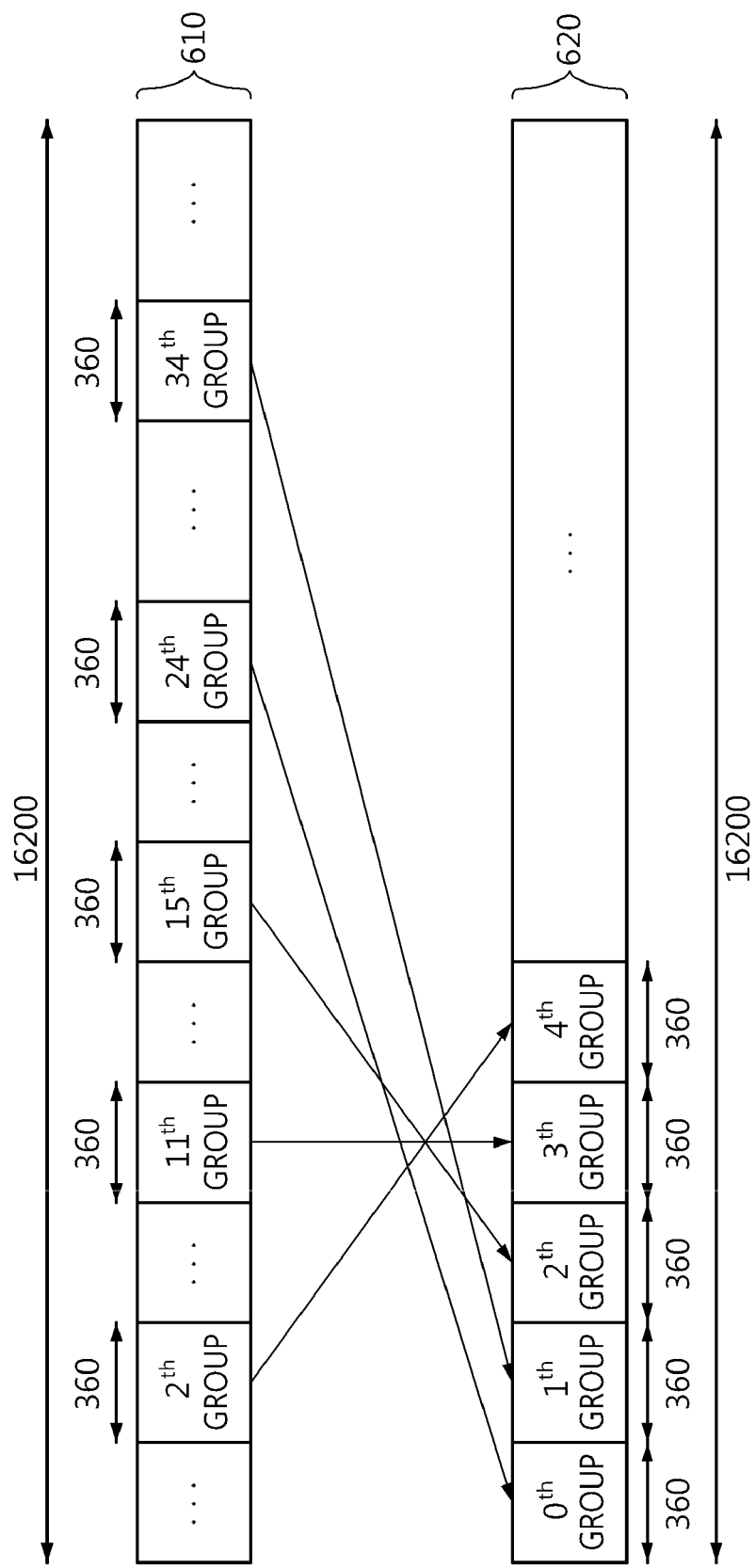
FIG. 6 is a diagram illustrating interleaving that is performed on a bit group basis in accordance with an interleaving sequence.

FIG. 6 is a diagram illustrating interleaving that is performed on a bit group basis in accordance with an interleaving sequence.

Referring to FIG. 6, it can be seen that interleaving is performed by changing the order of bit groups by a designed interleaving sequence.

For example, it is assumed that an interleaving sequence for an LDPC codeword having a length of 16200 is as follows:

interleaving sequence={24 34 15 11 2 28 17 25 5 38
 19 13 6 39 1 14 33 37 29 12 42 31 30 32 36
 40 26 35 44 4 16 8 20 43 21 7 0 18 23 3 10 41
 9 27 22}

Then, the order of the bit groups of the LDPC codeword illustrated in FIG. 4 is changed into that illustrated in FIG. 6 by the interleaving sequence.

That is, it can be seen that each of the LDPC codeword 610 and the interleaved codeword 620 includes 45 bit groups, and it can be also seen that, by the interleaving sequence, the 24th bit group of the LDPC codeword 610 is changed into the 0th bit group of the interleaved LDPC codeword 620, the 34th bit group of the LDPC codeword 610 is changed into the 1st bit group of the interleaved LDPC codeword 620, the 15th bit group of the LDPC codeword 610 is changed into the 2nd bit group of the interleaved LDPC codeword 620, and the 11st bit group of the LDPC codeword 610 is changed into the 3rd bit group of the interleaved LDPC codeword 620, and the 2nd bit group of the LDPC codeword 610 is changed into the 4th bit group of the interleaved LDPC codeword 620.

An LDPC codeword ($u_0, u_1, \ldots, u_{N_{ldpc}-1}$) having a length of $N_{ldpc}$ is divided into $N_{group} = N_{ldpc}/360$ bit groups, as in Equation 9 below:

$X_j = \{u_k | 360 \times j \leq k < 360 \times (j+1), 0 \leq k < N_{ldpc}\}$ for $0 \leq j < N_{group}$ \hfill (9)

where $X_j$ is an j-th bit group, and each $X_j$ is composed of 360 bits.

The LDPC codeword divided into the bit groups is interleaved, as in Equation 10 below:

$$Y_j = X_{\pi(j)} \quad 0 \le j \le N_{group} \quad (10)$$

where $Y_j$ is an interleaved j-th bit group, and π(j) is a permutation order for bit group-based interleaving (bit group-unit interleaving). The permutation order corresponds to the interleaving sequence of Equation 11 below:

interleaving sequence

={166 54 6 27 141 134 58 46 55 91 56 100 172 80
18 152 12 108 170 29 144 147 106 165 17 127
57 88 35 72 5 63 118 1 85 77 61 62 84 159 92
102 98 177 132 139 59 149 11 8 154 129 33
15 143 4 95 101 53 42 40 9 111 130 123 82 81
114 119 175 157 41 38 128 161 52 142 7 26
145 2 68 28 126 121 70 16 65 83 125 50 79 37
74 164 168 160 122 60 32 24 138 75 69 0 36
97 117 14 109 173 120 112 87 176 124 151 67
13 94 105 133 64 76 153 31 136 140 150 39
96 66 3 115 20 99 171 49 25 45 22 30 156 158
163 135 21 146 90 169 78 93 178 116 19 155
110 73 104 167 44 113 162 89 47 43 86 48
107 71 137 51 174 103 131 179 148 10 23 34}  (11)

That is, when each of the codeword and the interleaved codeword includes 180 bit groups ranging from a 0th bit group to a 179th bit group, the interleaving sequence of Equation 11 means that the 166th bit group of the codeword becomes the 0th bit group of the interleaved codeword, the 54th bit group of the codeword becomes the 1st bit group of the interleaved codeword, the 6th bit group of the codeword becomes the 2nd bit group of the interleaved codeword, the 27th bit group of the codeword becomes the 3rd bit group of the interleaved codeword, . . . , the 23th bit group of the codeword becomes the 178th bit group of the interleaved codeword, and the 34th bit group of the codeword becomes the 179th bit group of the interleaved codeword.

In particular, the interleaving sequence of Equation 11 has been optimized for a case where 64-symbol mapping (NUC symbol mapping) is employed and an LDPC coder having a length of 64800 and a code rate of 5/15 is used.

Figure 7:
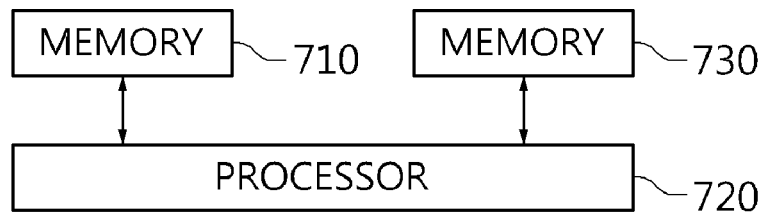
FIG. 7 is a block diagram illustrating a bit interleaver according to an embodiment of the present invention.

FIG. 7 is a block diagram illustrating a bit interleaver according to an embodiment of the present invention.

Referring to FIG. 7, the bit interleaver according to the present embodiment includes memories 710 and 730 and a processor 720.

The memory 710 stores an LDPC codeword having a length of 64800 and a code rate of 5/15.

The processor 720 generates an interleaved codeword by interleaving the LDPC codeword on a bit group basis corresponding to the parallel factor of the LDPC codeword.

In this case, the parallel factor may be 360. In this case, each of the bit groups may include 360 bits.

In this case, the LDPC codeword may be divided into 180 bit groups, as in Equation 9.

In this case, the interleaving may be performed using Equation 10 using permutation order.

In this case, the permutation order may correspond to the interleaving sequence represented by Equation 11.

The memory 730 provides the interleaved codeword to a modulator for 64-symbol mapping.

In this case, the modulator may be a symbol mapping device performing NUC (Non-Uniform Constellation) symbol mapping.

The memories 710 and 730 may correspond to various types of hardware for storing a set of bits, and may correspond to a data structure, such as an array, a list, a stack, a queue or the like.

In this case, the memories 710 and 730 may not be physically separate devices, but may correspond to different addresses of a physically single device. That is, the memories 710 and 730 are not physically distinguished from each other, but are merely logically distinguished from each other.

The error-correction coder 13 illustrated in FIG. 1 may be implemented in the same structure as in FIG. 7.

That is, the error-correction coder may include memories and a processor. In this case, the first memory is a memory that stores an LDPC codeword having a length of 64800 and a code rate of 5/15, and a second memory is a memory that is initialized to 0.

The memories may correspond to $\lambda_i$ (i=0, 1, . . . , N−1) and $P_j$ (j=0, 1, . . . , $M_1+M_2-1$), respectively.

The processor may generate an LDPC codeword corresponding to information bits by performing accumulation with respect to the memory using a sequence corresponding to a parity check matrix (PCM).

In this case, the accumulation may be performed at parity bit addresses that are updated using the sequence of the above Sequence Table.

In this case, the LDPC codeword may include a systematic part $\lambda_0, \lambda_1, \ldots, \lambda_{K-1}$ corresponding to the information bits and having a length of 21600 (=K), a first parity part $\lambda_K, \lambda_{K+1}, \ldots, \lambda_{K+M_1-1}$ corresponding to a dual diagonal matrix included in the PCM and having a length of 1440 (=$M_1$=g), and a second parity part $\lambda_{K+M_1}, \lambda_{K+M_1+1}, \ldots, \lambda_{K+M_1+M_2-1}$ corresponding to an identity matrix included in the PCM and having a length of 41760 (=$M_2$).

In this case, the sequence may have a number of rows equal to the sum (21600/360+1440/360=64) of a value obtained by dividing the length of the systematic part, that is, 21600, by a CPM size L corresponding to the PCM, that is, 360, and a value obtained by dividing the length $M_1$ of the first parity part, that is, 1440, by 360.

As described above, the sequence may be represented by the above Sequence Table.

In this case, the second memory may have a size corresponding to the sum $M_1+M_2$ of the length $M_1$ of the first parity part and the length $M_2$ of the second parity part.

In this case, the parity bit addresses may be updated based on the results of comparing each x of the previous parity bit addresses, specified in respective rows of the sequence, with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the first memory and the second memory, as described in conjunction with Equation 7.

In this case, the second parity part $\lambda_{K+M_1}, \lambda_{K+M_1+1}, \ldots, \lambda_{K+M_1+M_2-1}$ may be generated by performing parity interleaving using the first memory and the second memory after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

Figure 8:
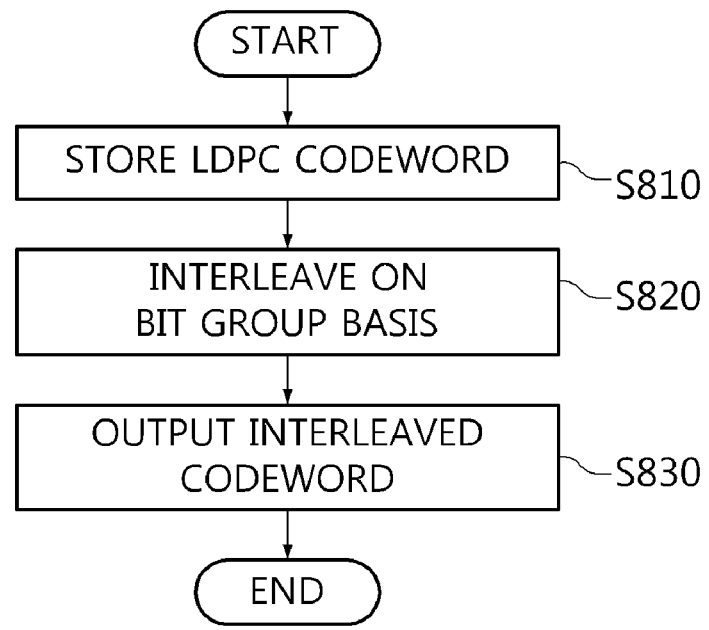
FIG. 8 is an operation flowchart illustrating a bit interleaving method according to an embodiment of the present invention.

FIG. 8 is an operation flowchart illustrating a bit interleaving method according to an embodiment of the present invention.

Referring to FIG. 8, in the bit interleaving method according to the present embodiment, an LDPC codeword having a length of 64800 and a code rate of 5/15 is stored at step S810.

In this case, the LDPC codeword may be represented by $(u_0, u_1, \ldots, u_{N_{ldpc}-1})$ (where $N_{ldpc}$ is 64800), and may be divided into 180 bit groups each composed of 360 bits, as in Equation 9.

Furthermore, in the bit interleaving method according to the present embodiment, an interleaved codeword is generated by interleaving the LDPC codeword on a bit group basis at step S820.

In this case, the size of the bit group may correspond to the parallel factor of the LDPC codeword.

In this case, the interleaving may be performed using Equation 10 using permutation order.

In this case, the permutation order may correspond to the interleaving sequence represented by Equation 11.

In this case, the parallel factor may be 360, and each of the bit groups may include 360 bits.

In this case, the LDPC codeword may be divided into 180 bit groups, as in Equation 9.

Moreover, in the bit interleaving method according to the present embodiment, the interleaved codeword is output to a modulator for 64-symbol mapping at step 830.

In accordance with at least one embodiment of the present invention, there is provided an intra-BICM bit interleaver that can effectively distribute burst errors occurring in a broadcasting system channel.

In accordance with at least one embodiment of the present invention, there is provided a bit interleaver that is optimized for an LDPC coder having a length of 64800 and a code rate of 5/15 and a modulator performing 64-symbol mapping and, thus, can be applied to next-generation broadcasting systems, such as ATSC 3.0.

Although the specific embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A bit-interleaved coded modulation (BICM) reception device, comprising:
   a demodulator configured to perform demodulation corresponding to 64-symbol mapping;
   a bit deinterleaver configured to perform group-unit deinterleaving on interleaved values, the interleaved values generated after the demodulation; and
   a decoder configured to restore information bits by LDPC-decoding deinterleaved values generated based on the group-unit deinterleaving, the deinterleaved values corresponding to an LDPC codeword having a length of 64800 and a code rate of 5/15,
   wherein the group-unit deinterleaving is performed on a group basis, the size of the group corresponding to a parallel factor of the LDPC codeword,
   wherein the LDPC codeword includes 21600 information bits, a first parity part of 1440 bits, and a second parity part of 41760 bits, the first parity part corresponding to a dual diagonal matrix, the second parity part corresponding to an identity matrix,
   wherein the group-unit deinterleaving corresponds to a reverse process of interleaving performed by using a permutation order, and
   wherein the permutation order corresponds to an interleaving sequence represented by the following interleaving sequence ={166 54 6 27 141 134 58 46 55 91 56 100 172 80
       18 152 12 108 170 29 144 147 106 165 17 127
       57 88 35 72 5 63 118 1 85 77 61 62 84 159 92
       102 98 177 132 139 59 149 11 8 154 129 33
       15 143 4 95 101 53 42 40 9 111 130 123 82 81
       114 119 175 157 41 38 128 161 52 142 7 26
       145 2 68 28 126 121 70 16 65 83 125 50 79 37
       74 164 168 160 122 60 32 24 138 75 69 0 36
       97 117 14 109 173 120 112 87 176 124 151 67
       13 94 105 133 64 76 153 31 136 140 150 39
       96 66 3 115 20 99 171 49 25 45 22 30 156 158
       163 135 21 146 90 169 78 93 178 116 19 155
       110 73 104 167 44 113 162 89 47 43 86 48
       107 71 137 51 174 103 131 179 148 10 23
       34}.

2. The BICM reception device of claim 1, wherein the 64-symbol mapping is a Non-Uniform Constellation (NUC) symbol mapping which corresponds to 64 constellations.

3. The BICM reception device of claim 1, wherein the parallel factor is 360, and the group includes 360 values.

4. The BICM reception device of claim 3, wherein the LDPC codeword is represented by $(u_0, u_1, \ldots, u_{N_{ldpc}-1})$ (where $N_{ldpc}$ is 64800), and the group corresponds to a bit group of the LDPC codeword in the following equation:

$$X_j = \{u_k | 360 \times j \leq k < 360 \times (j+1), 0 \leq k < N_{ldpc}\} \text{ for } 0 \leq j < N_{group}$$

where $X_j$ is an j-th bit group, $N_{ldpc}$ is 64800, and $N_{group}$ is 180.

5. A broadcast signal reception method, comprising:
   performing demodulation corresponding to 64-symbol mapping;
   performing group-unit deinterleaving on interleaved values, the interleaved values generated after the demodulation; and
   restoring information bits by LDPC-decoding deinterleaved values generated based on the group-unit deinterleaving, the deinterleaved values corresponding to an LDPC codeword having a length of 64800 and a code rate of 5/15,
   wherein the group-unit deinterleaving is performed on a group basis, the size of the group corresponding to a parallel factor of the LDPC codeword,
   wherein the LDPC codeword includes 21600 information bits, a first parity part of 1440 bits, and a second parity part of 41760 bits, the first parity part corresponding to a dual diagonal matrix, the second parity part corresponding to an identity matrix,
   wherein the group-unit deinterleaving corresponds to a reverse process of interleaving performed by using a permutation order, and
   wherein the permutation order corresponds to an interleaving sequence represented by the following interleaving sequence ={166 54 6 27 141 134 58 46 55 91 56 100 172 80
       18 152 12 108 170 29 144 147 106 165 17 127
       57 88 35 72 5 63 118 1 85 77 61 62 84 159 92
       102 98 177 132 139 59 149 11 8 154 129 33
       15 143 4 95 101 53 42 40 9 111 130 123 82 81
       114 119 175 157 41 38 128 161 52 142 7 26
       145 2 68 28 126 121 70 16 65 83 125 50 79 37
       74 164 168 160 122 60 32 24 138 75 69 0 36
       97 117 14 109 173 120 112 87 176 124 151 67

13 94 105 133 64 76 153 31 136 140 150 39
96 66 3 115 20 99 171 49 25 45 22 30 156 158
163 135 21 146 90 169 78 93 178 116 19 155
110 73 104 167 44 113 162 89 47 43 86 48
107 71 137 51 174 103 131 179 148 10 23
34}.

6. The broadcast signal reception method claim 5, wherein the 64-symbol mapping is a Non-Uniform Constellation (NUC) symbol mapping which corresponds to 64 constellations.

7. The broadcast signal reception method of claim 5, wherein the parallel factor is 360, and the group includes 360 values.

8. The broadcast signal reception method of claim 7, wherein the LDPC codeword is represented by ($u_0$, $u_1$, ..., $u_{N_{ldpc}-1}$) (where $N_{ldpc}$ is 64800), and the group corresponds to a bit group of the LDPC codeword in the following equation:

$$X_j = \{u_k | 360 \times j \leq k < 360 \times (j+1), 0 \leq k < N_{ldpc}\} \text{ for } 0 \leq j < N_{group}$$

where $X_j$ is an j-th bit group, $N_{ldpc}$ is 64800, and $N_{group}$ is 180.

* * * * *